(12) United States Patent
Ohnuki et al.

(10) Patent No.: US 12,235,618 B2
(45) Date of Patent: Feb. 25, 2025

(54) SIMULATION SYSTEM, SIMULATION METHOD, AND NON-TRANSITORY COMPUTER-READABLE STORAGE MEDIUM STORING SIMULATION PROGRAM

(71) Applicant: OMRON CORPORATION, Kyoto (JP)

(72) Inventors: Haruna Ohnuki, Kyoto (JP); Shintaro Iwamura, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 344 days.

(21) Appl. No.: 17/826,472

(22) Filed: May 27, 2022

(65) Prior Publication Data

US 2022/0397881 A1 Dec. 15, 2022

(30) Foreign Application Priority Data

Jun. 11, 2021 (JP) .................................. 2021-097766

(51) Int. Cl.
*G05B 19/042* (2006.01)
(52) U.S. Cl.
CPC ..................... *G05B 19/0426* (2013.01); *G05B 2219/23456* (2013.01)
(58) Field of Classification Search
CPC ............................ G05B 15/02; G05B 19/0426
USPC ........................................................ 700/86
See application file for complete search history.

(56) References Cited

U.S. PATENT DOCUMENTS

| 5,285,376 A * | 2/1994 | Struger | G05B 19/056 706/900 |
| 5,812,394 A * | 9/1998 | Lewis | G05B 19/0426 700/86 |
| 7,266,476 B2* | 9/2007 | Coburn | G05B 23/0216 700/86 |
| 11,061,377 B2* | 7/2021 | Muneta | G05B 19/056 |
| 2002/0120921 A1* | 8/2002 | Coburn | G05B 19/41885 703/21 |
| 2006/0095855 A1* | 5/2006 | Britt | G05B 19/042 715/764 |

(Continued)

FOREIGN PATENT DOCUMENTS

JP 2021-045797 A 3/2021

OTHER PUBLICATIONS

Extended European Search Report dated Oct. 21, 2022 in Application No. 22175653.9.

*Primary Examiner* — Ronald D Hartman, Jr.
(74) *Attorney, Agent, or Firm* — Sughrue Mion, PLLC

(57) ABSTRACT

Provided is a technique that enables simulation of an assembly in which unprepared components are combined. A simulation system includes a storage that stores data for use in a simulation, and a controller that executes the simulation. The controller receives an operation input for registration of a first component and a second component, receives an operation input for setting of an operation of an assembly including the first and second components, generates a program to operate the assembly on the basis of information on operations of the assembly, the first component, and the second component, and stores the program and the information on the operations of the assembly, the first component, and the second component in the storage as the data tor use in the simulation.

17 Claims, 16 Drawing Sheets

(56) References Cited

U.S. PATENT DOCUMENTS

| | | | | |
|---|---|---|---|---|
| 2010/0180267 A1* | 7/2010 | Huang | ............... | G05B 19/056 |
| | | | | 700/86 |
| 2012/0226368 A1* | 9/2012 | Thomson | ........... | G05B 19/0426 |
| | | | | 700/87 |
| 2015/0277415 A1* | 10/2015 | Senda | ................ | G05B 19/042 |
| | | | | 700/20 |
| 2019/0051049 A1 | 2/2019 | Shimakawa et al. | | |
| 2022/0091574 A1* | 3/2022 | Dong | ................ | G05B 19/056 |

* cited by examiner

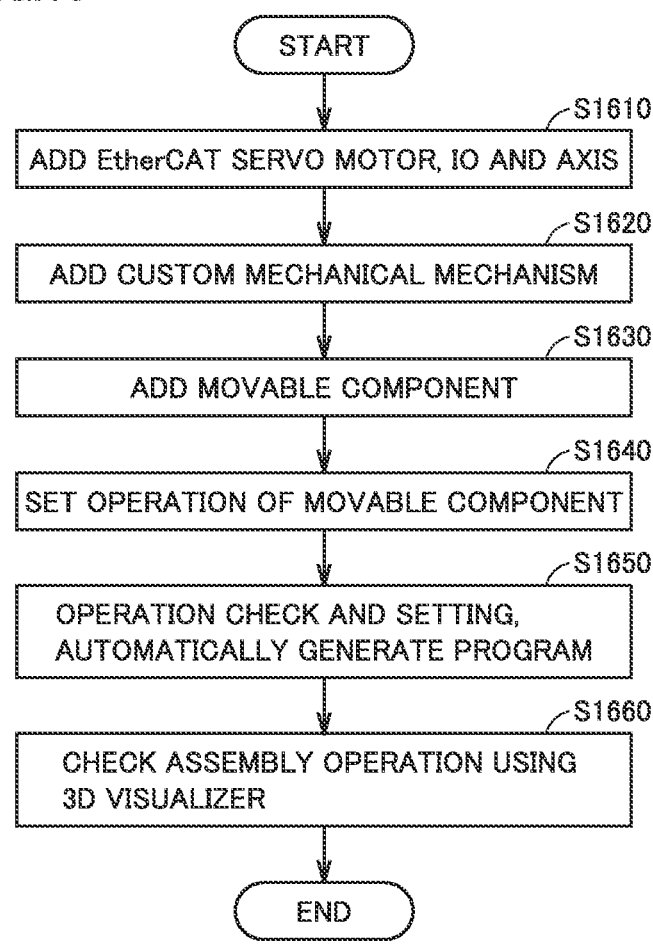

SIMULATION SYSTEM, SIMULATION METHOD, AND NON-TRANSITORY COMPUTER-READABLE STORAGE MEDIUM STORING SIMULATION PROGRAM

BACKGROUND OF THE INVENTION

Field of the Invention

The present disclosure relates to simulations, more particularly to a data customization feature for data used in the simulations.

Description of the Background Art

Computer-assisted simulations have been applied to various technical fields. Such simulations may be a great help for preliminary discussions and considerations of devices and apparatuses even before they are ready to be used.

Japanese Patent Laying-Open No. 2021-045797 describes an apparatus usable for the simulations. This apparatus is provided with a first behavior calculator and a second behavior calculator. The first behavior calculator calculates the behavior of a first target disposed in a virtual space that corresponds to a first device mounted with an accessory device. The second behavior calculator calculates the behavior of a second target disposed in a virtual space that corresponds to a second device mounted with an accessory device. It is further described in this literature that, for each one of predetermined time steps, the first behavior calculator calculates the behavior of the first target corresponding to the first device mounted with the accessory device in the relevant time step, and the second behavior calculator calculates the behavior of the accessory device mounted on the first device on the basis of the calculated behavior of the first, target (refer to the "Abstract").

SUMMARY OF INVENTION

The technique described in Japanese Patent Laying-Open No. 2021-045797, however, fails to simulate an assembly in which unprepared components are combined Therefore, a technique that enables simulation of an assembly in which unprepared components are combined is required.

The present disclosure has been made in view of the above background, and an object in an aspect is to provide a technique that enables simulation of an assembly in which unprepared components are combined.

In an embodiment of this disclosure, a simulation system is provided. The simulation system includes a storage configured to store data for use in a simulation, and a controller configured to execute the simulation. The controller receives an operation input for registration of a first component and a second component, receives an operation input for setting of an operation of an assembly including the first and second components, generates a program to operate the assembly on the basis of information on operations of the assembly, the first component, and the second component, and stores the program and the information on the operations of the assembly, the first component, and the second component in the storage as the data for use in the simulation.

As disclosed herein, the simulation system may store an assembly including optional components as data necessary for the simulation.

In the simulation system disclosed herein receiving the operation input for setting of the operation of the assembly includes receiving an operation input for registration of the first and second components in the assembly, receiving an operation input for setting of the operation of the second component, and receiving an operation input for setting of a connection between the first and second components.

As disclosed herein, the simulation system may set the operations of components of the registered assembly, and the connection between the different components.

In the simulation system disclosed herein, receiving the operation input for setting of the operation of the second component includes receiving an operation input for selection of an operation type of the second component, and receiving an operation input for setting of an operation range of the second component.

As disclosed herein, the simulation system may select the operation type and the operation range of a movable component.

In the simulation system disclosed herein, the program includes a ladder program of the assembly. Generating the program includes segmenting a module for each feature of the assembly and generating the ladder program.

As disclosed herein, the simulation system may segment the module for each feature of the assembly and generate the ladder program. This may lead to better readability of the ladder program, allowing a user to easily debug the ladder program.

In the simulation system disclosed herein, generating the program includes changing a section for each feature of the assembly and generating the ladder program.

As disclosed herein, the simulation system may change the section for each feature of the assembly. This improves reusability of the ladder program.

In the simulation system disclosed herein, generating the program includes generating one or a plurality of variables included in the program based on the information on the operations of the assembly, the first component, and the second component.

As disclosed herein, the simulation system may automatically generate the variable to be inserted into the program based on the information on the operations of the assembly, the first component, and the second component.

In the simulation system disclosed herein, the program includes a text code. Generating the program includes obtaining, from the storage, a template in which a command included in the text code is defined, and inserting the variable into the template to generate the text code.

As disclosed herein, the simulation system may generate a test code that excels in readability in accordance with the template. This may allow a user to easily edit and debug the text code.

In the simulation system disclosed herein, the controller is configured to receive an operation input for editing of the program.

As disclosed herein, the simulation system may receive the operation input for editing of the generated program. By editing the automatically generated program, a user may develop a desired program mote efficiently than starts coding from a scratch.

In another embodiment of this disclosure, a simulation method executable by a computer is provided. The simulation method includes: receiving an operation input for registration of a first component and a second component; receiving an operation input for setting of an operation of an assembly including the first and second components; generating a program to operate the assembly on the basis of information on operations of the assembly, the first component, and the second component; and storing the program and the information on the operations of the assembly, the first component, and the second component as the data for use in the simulation.

As disclosed herein, the simulation method may store an assembly including optional components as data necessary for simulation.

In yet another embodiment of this disclosure, a non-transitory computer-readable medium comprising instructions is provided. The instructions, when executed by a simulation system, cause the simulation system to: receive an operation input for setting of an operation of an assembly including the first and second components; generate a program to operate the assembly on the basis of information on operations of the assembly, the first component, and the second component; and store the program and the information on the operations of the assembly, the first component, and the second component as the data for use in the simulation.

As disclosed herein, the simulation system may store an assembly including optional components as data necessary for simulation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 is a flowchart illustrating an example of an internal processing flow of the simulation system.

DESCRIPTION OF THE PREFERRED EMBODIMENTS

Embodiments of the technical idea according to the present disclosure are hereinafter described with reference to the accompanying drawings. In the description below, like components are illustrated with the same reference signs. Also, they are referred to likewise and have similar functional features. Such components, therefore, will not be repeatedly described in detail.

A. Example of Application

Figure 1:
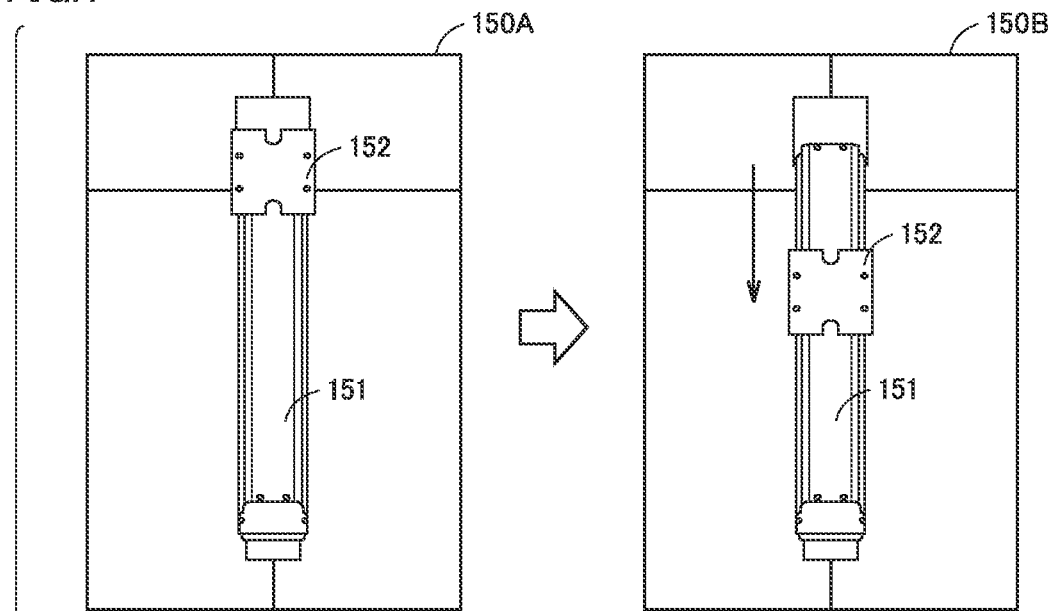
FIG. 1 is a diagram illustrating an example of an assembly that can be simulated by a simulation system according to an embodiment.
Figure 1:
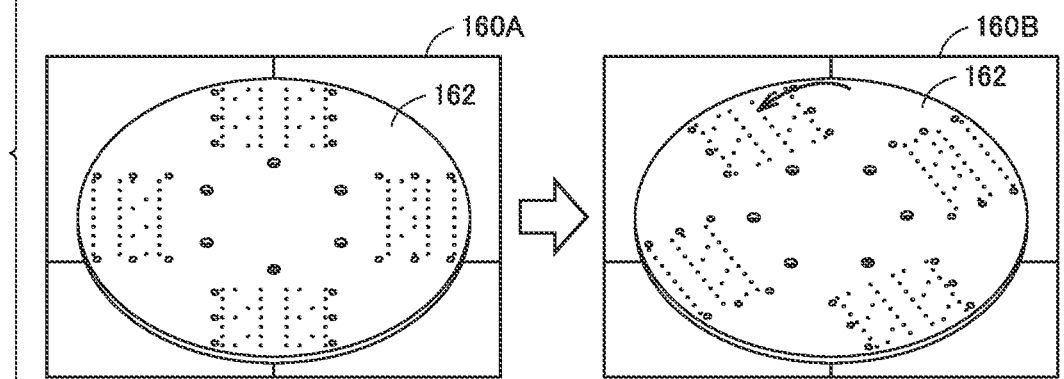
Figure 1:
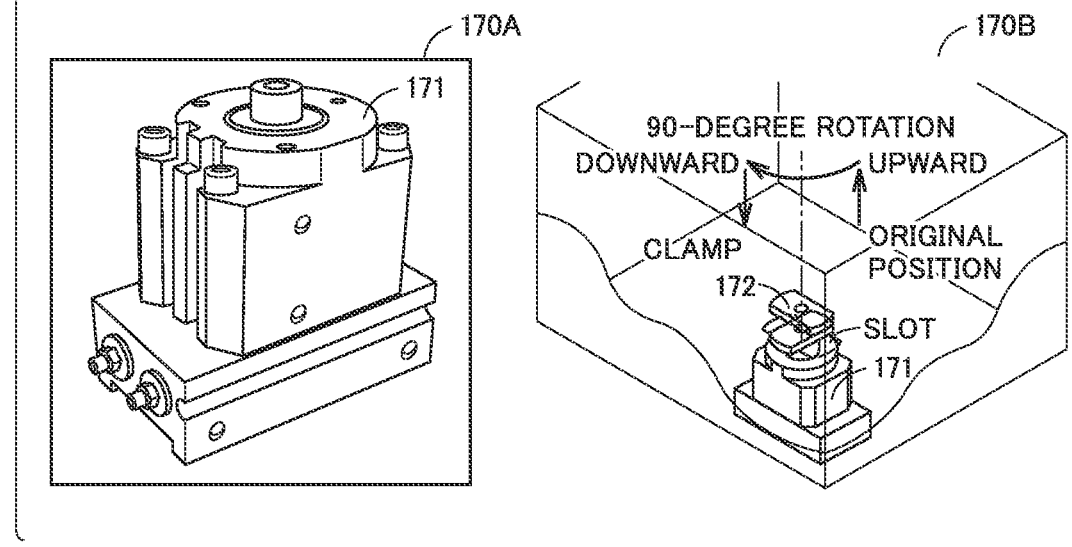

FIG. 1 is a diagram illustrating an example of an assembly that can be simulated by a simulation system according to an embodiment. The simulation system according to this embodiment (hereinafter, referred to as "simulation system") may be used to check the operations of a device(s) available in factory automation (FA) and to check the operation of a program to operate the device(s).

Referring to FIG. 1, a description is given to types of devices to be simulated by the simulation system and features offered by the simulation system.

a. Device Targeted for Simulation

The description starts with components and an assembly used in the simulation. In devices and apparatuses often used in factories and the like, different components are generally combined. Such a device or apparatus may be called an assembly. The simulation system simulates the operation of this assembly. The assembly illustrated in FIG. 1 is just one of typical examples that cart be subject to the simulation by the simulation system. In an aspect, the simulation system may simulate the operation of an optional assembly including one or a plurality of optional components.

Data used in the simulation system includes component data generated with use of, for example, three-dimensional computer-aided design (3DCAD) software or the like. The simulation system uses assembly data in which different components are combined. In an aspect, the assembly may include, in part, an assembly or a component(s) or both of them. For instance, an assembly (A) may include an assembly (B), an assembly (C), and a component (D). In the description below, the "component" and the "assembly" used in the simulation indicates the component data and assembly data.

A screen 150A and a screen 150B are examples of a simulation screen of an assembly including linear motion components. This assembly includes a first component 151 and a second component 152. Second component 152 moves and operates linearly on first component 151.

A screen 160A and a screen 160B are examples of a simulation screen of an assembly including rotary components. This assembly includes a second component 162 and a first component (not illustrated) located below second component 162. Second component 162 is rotatable on the first component.

A screen 170A and a screen 170B are examples of a simulation screen of an assembly including linear motion components. Screen 170A displays thereon a first component 171 constituting this assembly. Screen 170B displays-thereon the operation of a second component 172 attached to an upper shaft of first component 171. Second component 172 moves up and down and rotate at once on first component 171.

The simulation system may simulate the operation of an optional assembly that performs a linear or rotary motion or both of linear and rotary motions combined. In an aspect, the simulation system may simulate a structurally complicated assembly including three or more components.

b. Functional Features of Simulation System

Next, features of the simulation system are hereinafter described. The simulation system mainly includes an assembly customizing feature, a ladder program generating feature, and a template-used text code generating feature.

First, the assembly customizing feature, which is a first feature, is described. The simulation system has a feature that registers therein a new assembly. The simulation system may perform simulation using an assembly registered in this system. Since the FA uses a broad range of devices, some assemblies are still unregistered in the simulation system.

To this end, the simulation system provides features that allow a user to register an optional assembly in the simulation system. Specifically, a user may perform the following operations through a user interlace (UI) provided by the simulation system.

First, a user registers one or more components created using 3DCAD or the like in the simulation system as a part of the assembly. This registration operation may include locating the components in a 3D space. For instance, with reference to screen 150A, the user may locate second component 152 in contact with first component 151 in the 3D space. In other words, the user defines the assembly based on a plurality of components.

Next, the user sets the operation of each component. For example, the user may select the operation type of a certain component from an operation list. The user may set an operation range of a certain component. For instance, with reference to screen 150A, the user sets the operation of second component 152 to a linear motion. The user further sets the operation range of second component 152 to a certain range of first component 151 in its longitudinal direction.

Next, the user sets a connection between different components. The "connection" refers to how the different components are specifically connected to each other. For instance, with reference to screen 150A, the user may connect second component 152 to first component 151 in a manner that these components are only allowed to slide relative to each other. In an aspect, the user may set a plurality of connections between the components. In another aspect, the connection may include positional offset. The connection is a kind of restriction.

By using the first feature, a user may register in the simulation system an optional assembly not registered in the simulation system, and further generate operation information on this assembly. The operation information of the assembly may practically include the operations of and/or a connection relationship between the components included in the assembly (operational restrictions).

Next, the ladder program generating feature, which is a second feature, is described. Registering the new assembly in the simulation system does not enable the simulation system to perform the simulation of the new assembly. Therefore, the simulation system generates a ladder program that enables the newly registered assembly to operate based on the operation information of the registered assembly and components.

Specifically, the simulation system may modularize the generated ladder program in accordance with features and operation of the new assembly. For example, the generated ladder program may include an assembly activation module, an initialization module, and an assembly operation module. The module described herein may refer to a functional unit called a program organization unit (POU).

By segmenting the ladder program into modules based on the features and operation of the assembly, a user may easily debug and reuse the ladder program of a newly registered assembly.

Lastly, the template-used text code generating feature, which is a third feature, is described. The simulation system may generate a text code program to help a user easily define the operation of the assembly.

The text code generated by the simulation system may include, for example, a command for each mathematical function. In an aspect, the text code may include class members, structural units, and the like. The mathematical functions may each correspond to a command of the ladder program.

First, the simulation system defines variables used in the text code based on the operation information and the like of the registered components and assembly. In an aspect, the variables in the text code may be associated with variables in the ladder program.

Next, the simulation system obtains a prepared template from a storage 111 (see FIG. 3) and inserts the variables into the obtained template. Thus, the simulation system may provide a user with the text code of the assembly newly registered in a format that accords to the template at all times. This leads to better readability of the text code.

In an aspect, the template may include a template of the ladder program. In this case, the simulation system may select a template based on the operation information of the assembly, and insert variables into the selected template. In another aspect, the simulation system may generate the text code per unit corresponding to each module of the ladder program. In another aspect, the simulation system may generate the mathematical function per unit corresponding to each module of the ladder program. By having the ladder program and the text code associated with each other, a user may easily debug both of the ladder program and the text code.

As described above the simulation system offers the assembly registration feature and the program (ladder program and text code) generating feature. The assembly and the program may be stored in storage 111 as data necessary for the simulation or part of the necessary data. In an aspect, the simulation system may automatically generate the program (ladder program and text code) based on the operation information of the registered components and assembly. In another aspect, the simulation system may generate the program (ladder program and text code) in response to a user's operation such as pressing a button.

B. System Configuration

Figure 2:
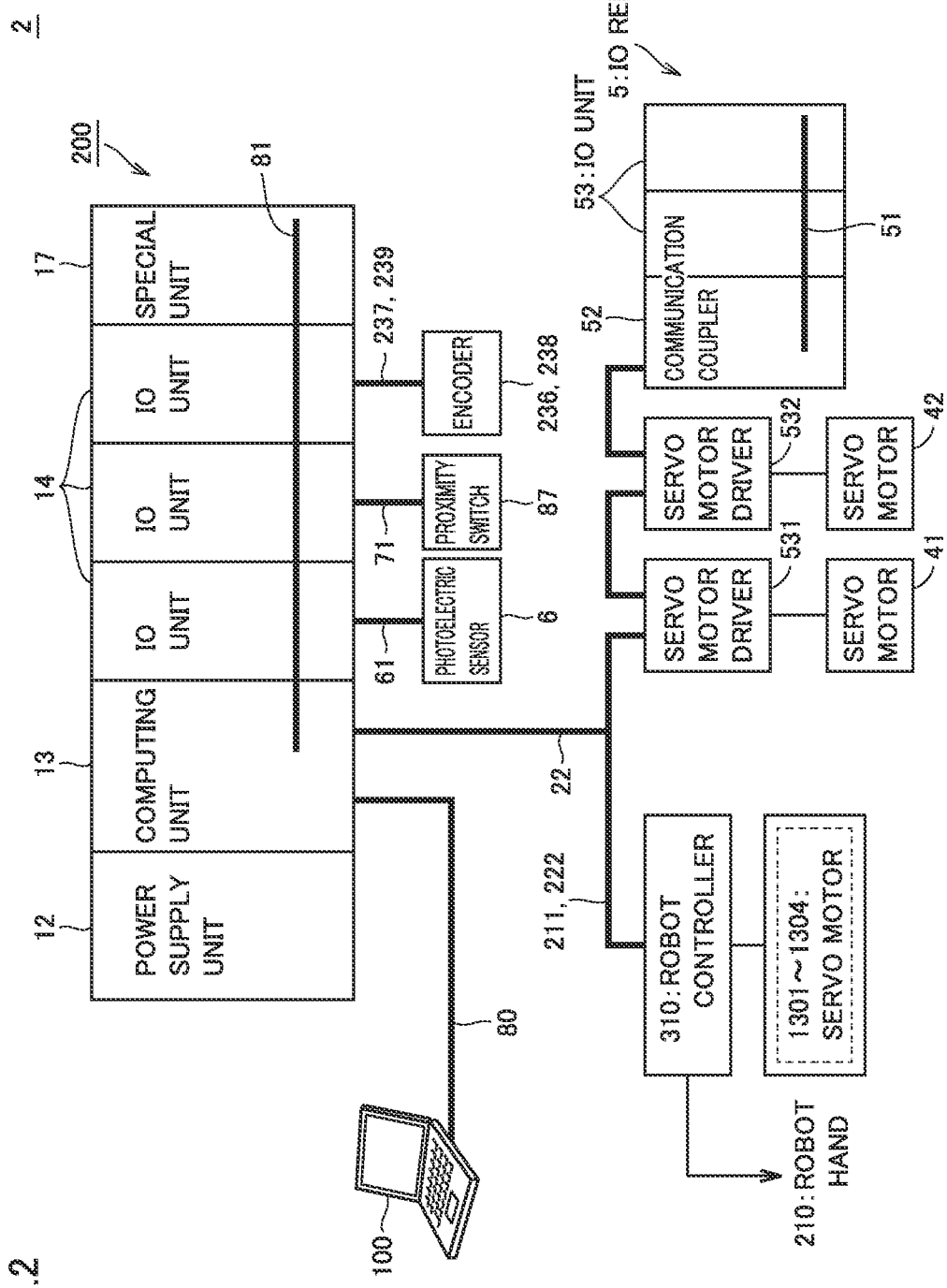
FIG. 2 is a diagram illustrating an example of a unit configuration of a control system 2 including a machine to which a simulation technique according to the embodiment is applicable.
Figure 3:
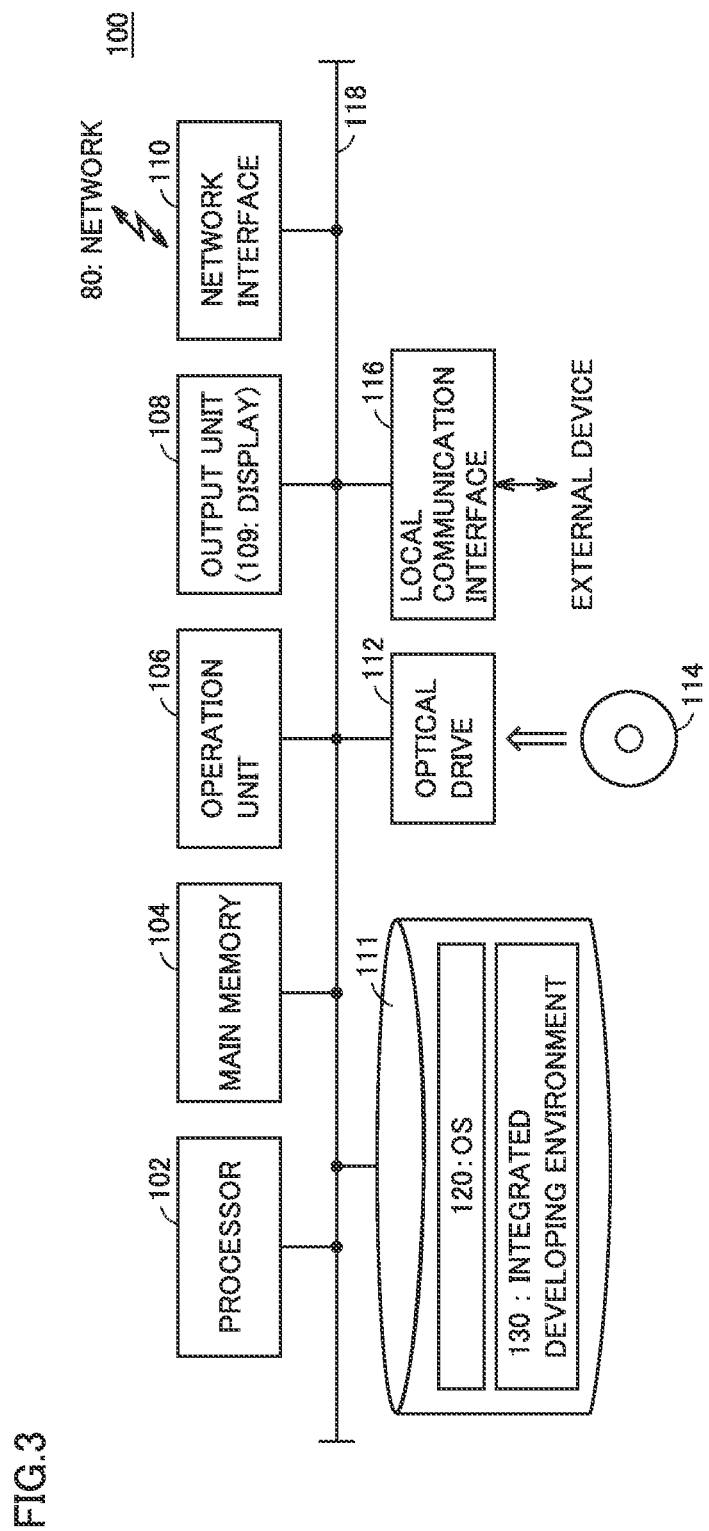
FIG. 3 is a diagram illustrating an example of a configuration of a device that operates as the simulation system.
Figure 4:
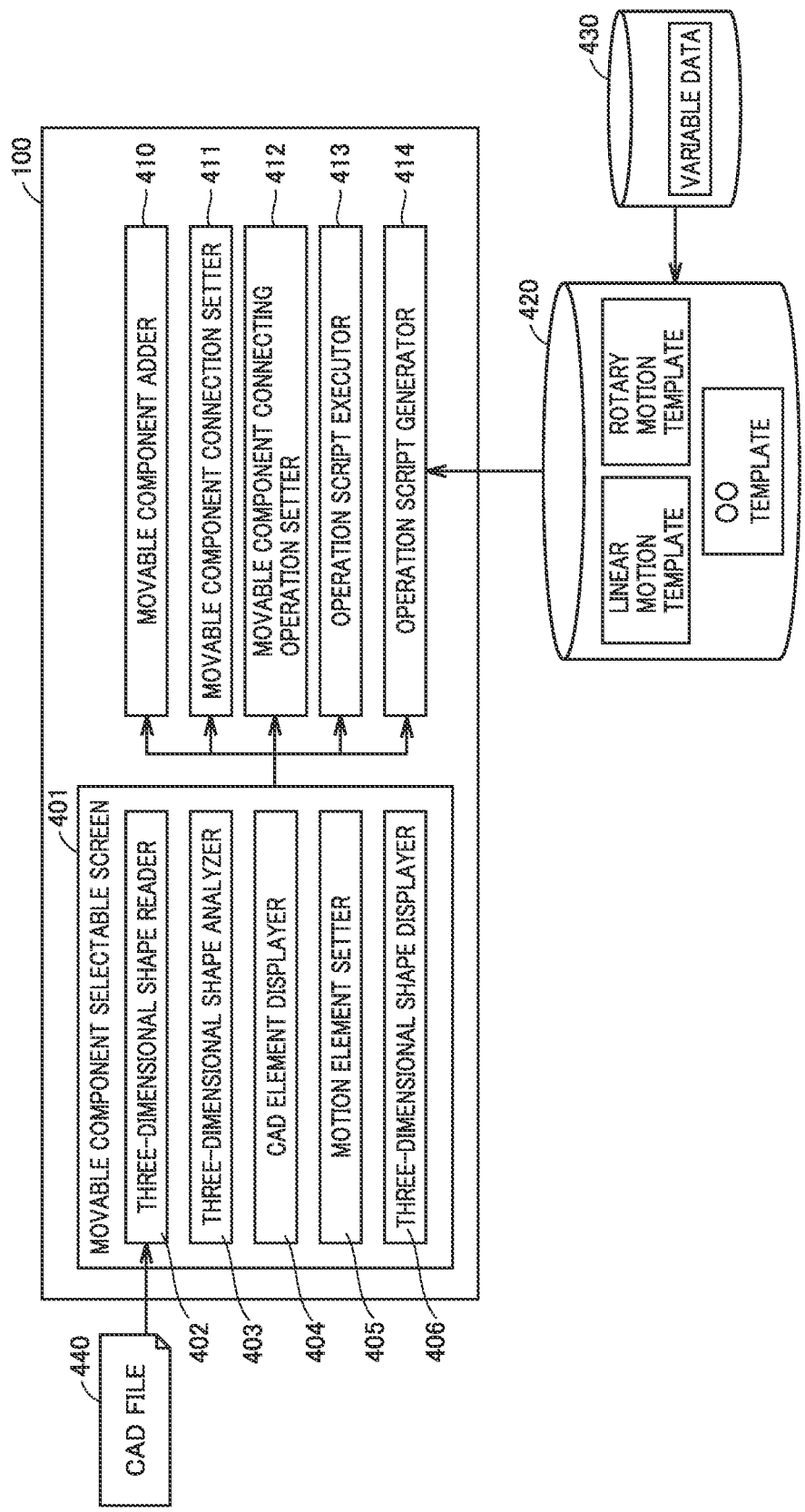
FIG. 4 is a diagram illustrating an example of constituent elements of a device 100.

Referring to FIGS. 2 to 4, a configuration example of a system that uses an assembly and hardware configuration and functional configurations of a device that actuates the simulation system are described.

FIG. 2 is a diagram illustrating an example of a unit configuration of a control system 2 including a machine to which a simulation technique according to the embodiment is applicable. The assemblies illustrated in FIG. 1 may be each used as a device included in control system 2 or a part of the device. For example, the assembly, the operation of which is to be verified by the simulation system, may be a device(s) driven by servo motors 41 and 42, a robot hand 210 controlled by a robot controller 310, a tool attached to an edge of robot hand 210, or any other optional device.

Control system 2 includes, for example, a programmable logic controller (PLC) 200, an IO remote terminal 5 and servo motor drivers 531 and 532 that are connected to PLC 200 through a field network 22, a robot controller 330, and IO devices disposed in the field (photoelectric sensor 6, proximity switch (or proximity sensor) 87 of a stopper or the like, encoders 236, 238, and the like).

PLC 200 includes a computing unit 13 that executes main computing processes, one or more IO units 14, and a special unit 17. These units are configured to transmit and receive data to and from one another through a system bus 81 and receive power supply from a power supply unit 12. A device 100 for simulation use is connectable to computing unit 13.

Device 100 may operate as the simulation system and simulate the operation of the assembly. Device 100 may install, into computing unit 13, a program of the assembly, the operation of which has been verified by the simulation. Computing unit 13 may control each device (assembly) included in control system 2 on the basis of the installed program. Device 100 may be connected to computing unit 13 through a network 80.

An IO unit 14 collects detected values 61, 71, 237 and 239 from the IO devices including photoelectric sensor 6, proximity switch 87 of a stopper or the like, encoders 236 and 238, and the like. For example, proximity switch 87 detects, in a non-contact manner, that a tray has approached the stopper to a predetermined distance. The detected values from the IO devices is set (written in) to corresponding bits of a memory of IO unit 14.

Computing unit 13 executes computations of the control program using values collected by IO unit 14 and sets (writes in) values of an obtained result to corresponding bits in IO unit 14. A peripheral device(s) or the IO devices are operated with reference to the bit values in IO unit 14. Thus, PLC 200 can control robot, conveyer, or the tike, which are to be controlled, by transmitting and receiving data to and from the IO devices and the peripheral device(s) through IO unit 14.

Special unit 17 has features unsupported by IO unit 14, including input and output of analog data, temperature control, communication through a particular communication system.

For example, robot controller 310, servo motor drivers 531 and 532, IO remote terminal 5, and the like may be connected to field network 22.

As with IO unit 14, IO remote terminal 5 basically carries out typical processes associated with inputs and outputs. Specifically, IO remote terminal 5 includes one or more IO units 53 and a communication coupler 52 used to carry out processes associated with data transmission in field network 22. These units are configured to transmit and receive data to and from one another through an IO remote terminal bus 51.

Servo motor drivers 531 and 532 are connected to computing unit 13 through field network 22 and drive servo motors 41 and 42 in accordance with command values received from computing unit 13. Specifically, servo motor drivers 331 and 532 receive, from PLC 200, command values including a position command value, a speed command value and a torque command value, at constant time intervals, for example, control periods. Computing unit 13 generates these command values based on detected values 237 and 239 from encoders 236 and 238.

Computing unit 13 refers to the detected values from the IO devices described earlier and runs a predetermined control program. Thus, computing unit 13 may allow a robot hand 210 to perform handling of a work, for example, picking up, placing and pressing down the work.

Specifically, computing unit 13 generates a control command 211 for the robot arm and a control command 222 for robot hand 210 and outputs these control command signals to robot hand 210 through robot controller 310. At the time of generating control command 211, computing unit 13 may refer to a value indicative of the status of robot hand 210 in addition to detected values 61 and 71 from the IO devices described above. The robot arm may include an optional number of servo motors, for example, servo motors 1301 to 1304.

FIG. 3 is a diagram illustrating an example of a configuration of a device that operates as the simulation system. The simulation described with reference to FIG. 1 is executable by software on device 100.

Device 100 includes, as its principal constituent elements, an operating system (OS), a processor 102 that executes programs described below, a main memory 104 that provides a working area to store data required for processor 102 to run the programs, an operation unit 106 (operation input receiver) including a keyboard, a mouse, and the like manipulated by a user, a display 109, indicators, an output unit 108 that outputs a processing result like a printing result, a network interface 110 connected to various networks including network 80, an optical drive 112, a local communication interface 116 that communicates with an external device(s), and a storage 111. These components are interconnected through an internal bus 118 in a manner that they are allowed to communicate data to and from one another.

Device 100 includes optical drive 112. Programs may be read through this optical drive from a computer-readable recording medium 114 and then installed into storage 111. Examples of computer-readable recording medium 114 may include optical recording media in which computer-readable programs are non-transitorily stored (for example, a digital versatile disc (DVD) or the like).

The programs to be executed by device 100 may be installed into device 100 through computer-readable recording medium 114 or may be installed into device 100 through network interface 110 from a server device or the like (not illustrated) on a network.

Storage 111 includes for example, a hard disk drive (HDD) or a flash solid state drive (SSD), and stores a program(s) executed by processor 102. Specifically, storage 111 stores an operating system (OS) 120 and an integrated developing environment 130. Integrated developing environment 130 may be actualized in the form of an application that operates on OS 120.

Integrated developing environment 130 provides the first, second and third features described with reference to FIG. 1. Integrated developing environment 130 receives an operation input for registration of an assembly and components newly used in the simulation. Integrated developing environment 130 further receives an operation input for setting of operation information of the registered assembly. Integrated developing environment 130 also generates the program of the registered assembly.

In an aspect, the assembly customizing feature, ladder program generating feature, and template-used text code generating feature described with reference to FIG. 1 are feasible as add-in features of integrated developing environment 130.

In another aspect, integrated developing environment 130 may be executed as software by a system including a plurality of devices 100 or at least a part of hardware configurations of device(s) 100 or by a virtual machine on a cloud platform including at feast a part of hardware configurations of device(s) 100.

In an aspect, device 100 may actualize the features of integrated developing environment 130, in whole or in part, using an application specific integrated circuit (ASIC), a field-programmable gate array (FPGA), or the like.

FIG. 4 is a diagram illustrating an example of constituent elements of device 100. The elements illustrated in FIG. 4 are feasible by having integrated developing environment 130 executed as software on the hardware platform illustrated in FIG. 3. The elements illustrated in FIG. 4 may operate in coordination with one another and thereby provide the first, second and third features described with reference to FIG. 1.

Device 100 includes, as its principal elements, a movable component selectable screen 401, a movable component adder 410, a movable component connection setter 411, a movable component connecting operation setter 412, an operation script executor 413, and an operation script generator 414. Movable component selectable screen 401 includes a three-dimensional shape reader 402, a three-dimensional shape analyzer 403, a CAD element displayer 404, a motion element setter 405, and a three-dimensional shape displayer 406. Device 100 may write and read data in and out of a template set 420 and a variable data set 430.

Movable component, selectable screen 401 is used to register new components in the simulation system. Movable component selectable screen 401 may include screens for input of the definition of an assembly and operation settings of the assembly or components and for display and editing of the program.

Three-dimensional shape reader 402 reads new components. For example, a user may select a CAD file 440 (new component or the like) from storage 111 or an external device by operating movable component selectable screen 401. Three-dimensional shape reader 402 can read the selected new component. CAD file 440 may include one or more components.

Three-dimensional shape analyzer 403 analyzes CAD file 440 which has been read by three-dimensional shape reader 402. For instance, three-dimensional shape analyzer 403 may analyze various information included in CAD file 440, for example, shape of one or more components, a connection relationship between the components, dimensions and materials of the components, or the like.

CAD element displayer 404 displays, on movable component selectable screen 401, the various information analyzed by three-dimensional shape analyzer 403. For instance, CAD element displayer 404 may display, on movable component selectable screen 401, information including, for example, shape of an analyzed component(s), connection(s) of the relevant component(s), dimensions and materials of the relevant component(s), and the like.

Motion element setter 405 provide a motion setting feature by which the motion of a read component is settable. For instance, a user can set the operation (motion) of second component 152 by using the feature of motion element setter 405 as illustrated in FIG. 1.

Three-dimensional shape displayer 406 displays, in the 3D space, the components read into the simulation system.

Movable component adder 410 provides a feature that adds movable component(s) to the simulation system. The feature of movable component adder 410 may be executed based on an operation input through movable component selectable screen 401. For instance, movable component adder 410 may add, to an assembly, a component(s) included in CAD file 440 selected from storage 111 or the like based on a user's operation. In an aspect, CAD file 440 added by movable component adder 410 may be transmitted to three-dimensional shape reader 402.

Movable component connection setter 411 sets a connection(s) between components included in an assembly. The feature of movable component connection setter 411 may be executed based on an operation input through movable component selectable screen 401. For instance, movable component connection setter 411 sets a connection between a first component and a second component based on a user's operation.

Movable component connecting operation setter 412 sets the operation of a component(s) included in an assembly. The feature of movable component connecting operation setter 412 may be executed based on an operation input through movable component selectable screen 401. For instance, movable component connecting operation setter 412 sets the motion of the second component toward the first component based on a user's operation. This operation setting may include setting of an operation type and an operation range.

Operation script executor 413 executes the script (program) of an assembly whose operation has been defined on movable component selectable screen 401. The feature of operation script executor 413 may be executed based on an operation input through movable component selectable screen 401.

Operation script generator 414 generates the script of an assembly whose operation has been defined on movable component selectable screen 401. The feature of operation script generator 414 may be executed based on an operation input through movable component selectable screen 401. The script generated by operation script generator 414 may include a ladder program, and a text code. Operation script generator 414 generates variable data from operation settings or the like of the assembly and stores the generated variable data in variable data set 430. Based on operation settings or the like of the assembly, operation script generator 414 selects a particular template included in template set 420. Operation script generator 414 inserts the variable data into the selected template to generate a program. In an aspect, the template may be a text code template. In another aspect, the template may include a ladder program template in addition to a text code template.

Template set 420 and variable data set 430 may be expressed in a relational database or in any other optional format. Template set 420 and variable data, set 430 are stored in storage 111 or the like.

C. Addition of Components

Next, referring to FIGS. 5 to 8, steps of adding an assembly including a plurality of components to the simulation system are described. The screens illustrated in FIGS. 5 to 8 are displayed on display 109.

Figure 5:
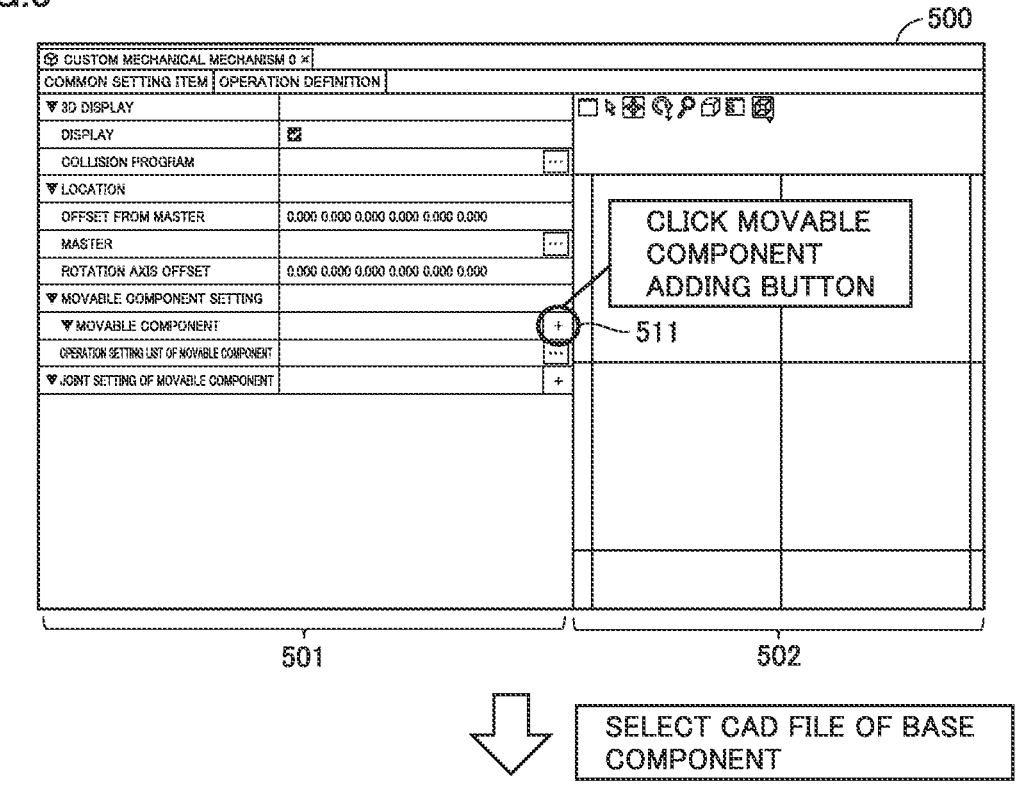
FIG. 5 is a diagram illustrating a first example of an operation flow of components being added to the simulation system.
Figure 5:
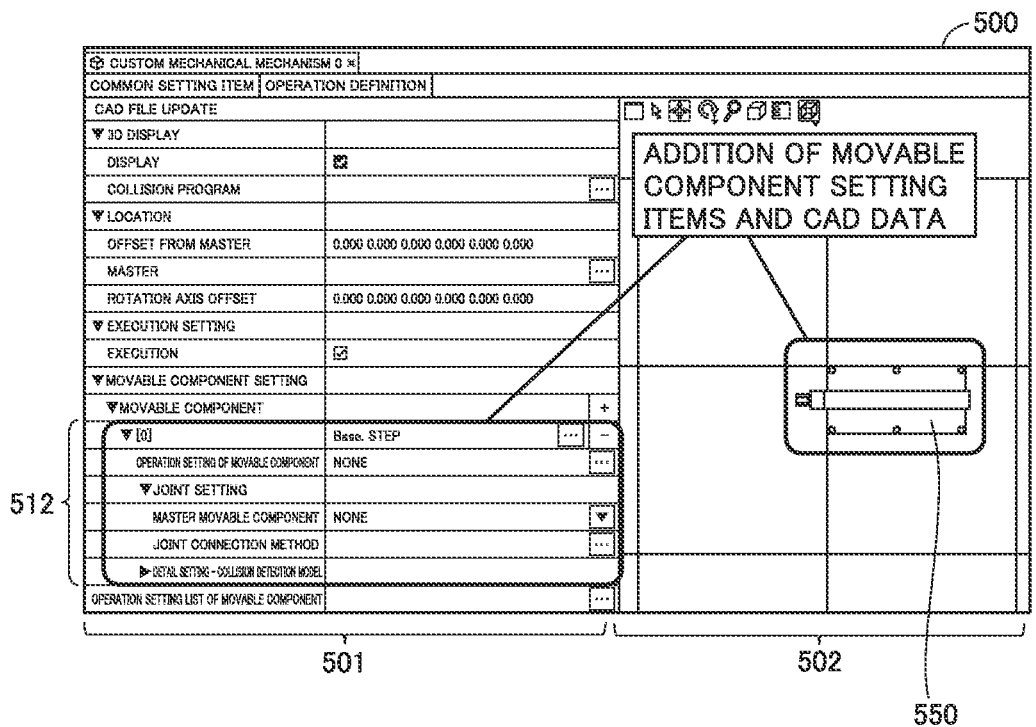

FIG. 5 is a diagram illustrating a first example of an operation flow of components being added to the simulation system. A screen 500 is a form of display of movable component selectable screen 401. Screen 500 includes a setting screen 501 and a 3D screen 502. Setting screen 501 displays the settings of a component (CAD data) currently displayed on 3D screen 502. Setting screen 501 receives an operation input for editing of the component settings. 3D screen 502 displays the CAD data of a component registered in the 3D space. 3D screen 502 receives an operation input for moving the CAD data of the component.

Screen 500 further includes a movable component adding button 511. A user may add a new component to the simulation system by pressing movable component adding button 511. Specifically, a file selection dialog (not illustrated) is displayed on display 109 in response to movable component adding button 511 being pressed by the user. The user may select a new component through the file selection dialog and register the new component in the simulation system. In the example illustrated in FIG. 5, an added component 550 is being displayed on 3D screen 502. Also, setting items 512 of component 550 are displayed on setting screen 501. The user may move (relocate) component 550 and edit setting items 512 through screen 500.

Figure 6:
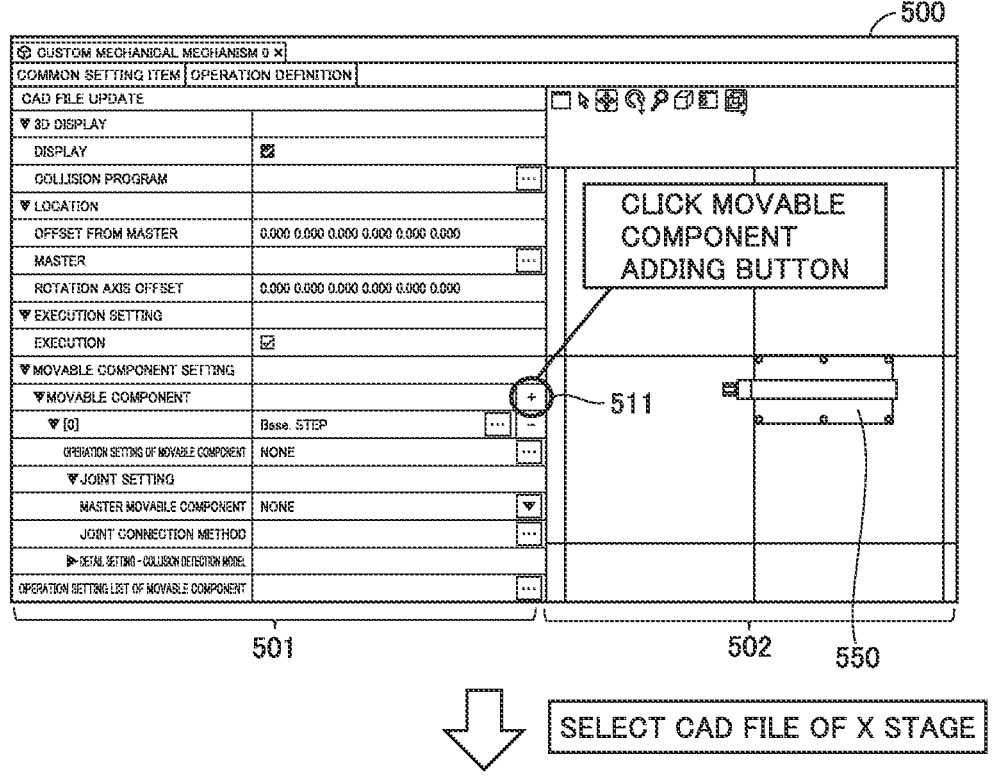
FIG. 6 is a diagram illustrating a second example of the operation flow of components being added to the simulation system.
Figure 6:
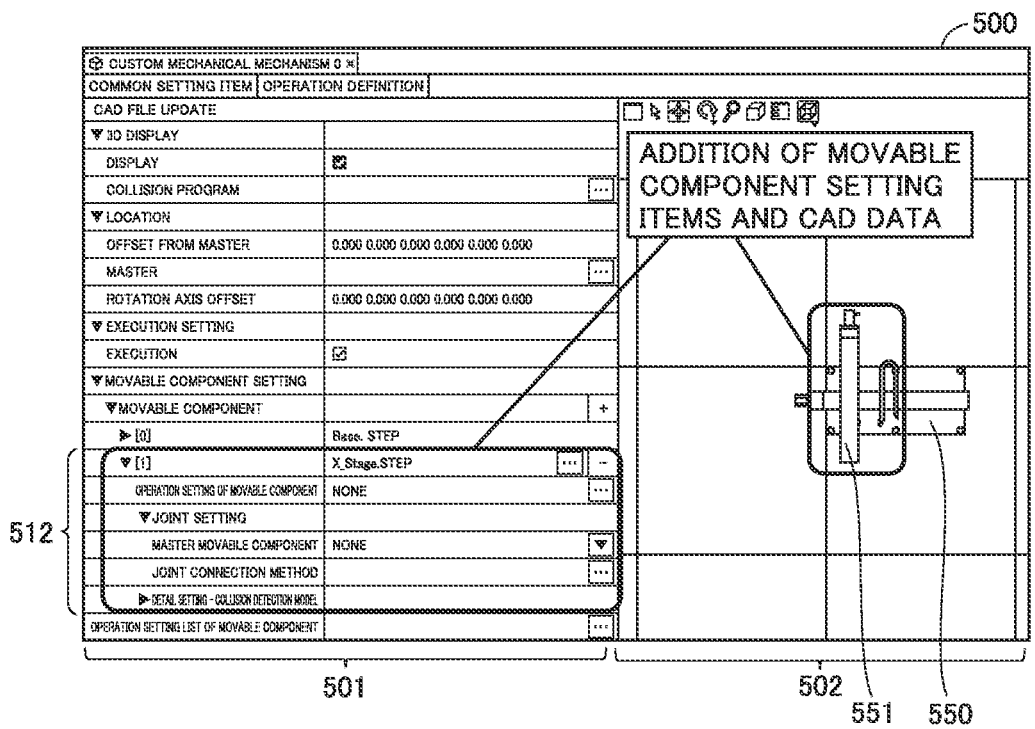

FIG. 6 is a diagram illustrating a second example of the operation flow of components being added to the simulation system. In the example illustrated in FIG. 6, a user further adds a component 551 to the simulation system by pressing movable component adding button 511. Setting screen 501 displays setting items 512 of a component currently selected on 3D screen 502.

Figure 7:
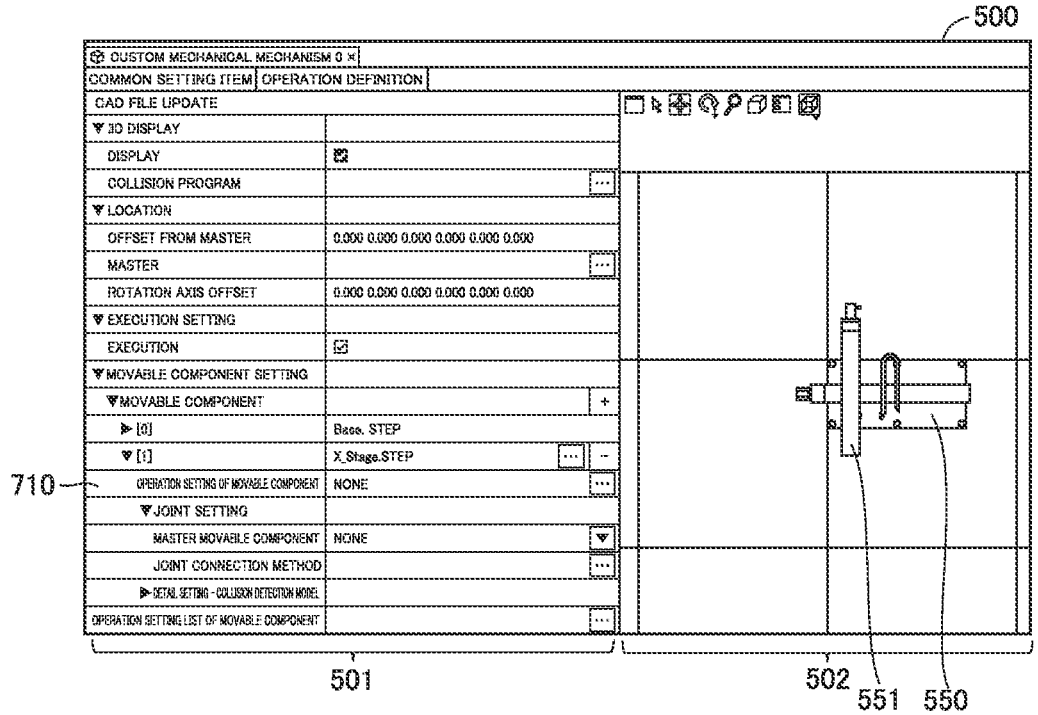
FIG. 7 is a diagram illustrating a third example of the operation flow of components being added to the simulation system.
Figure 7:
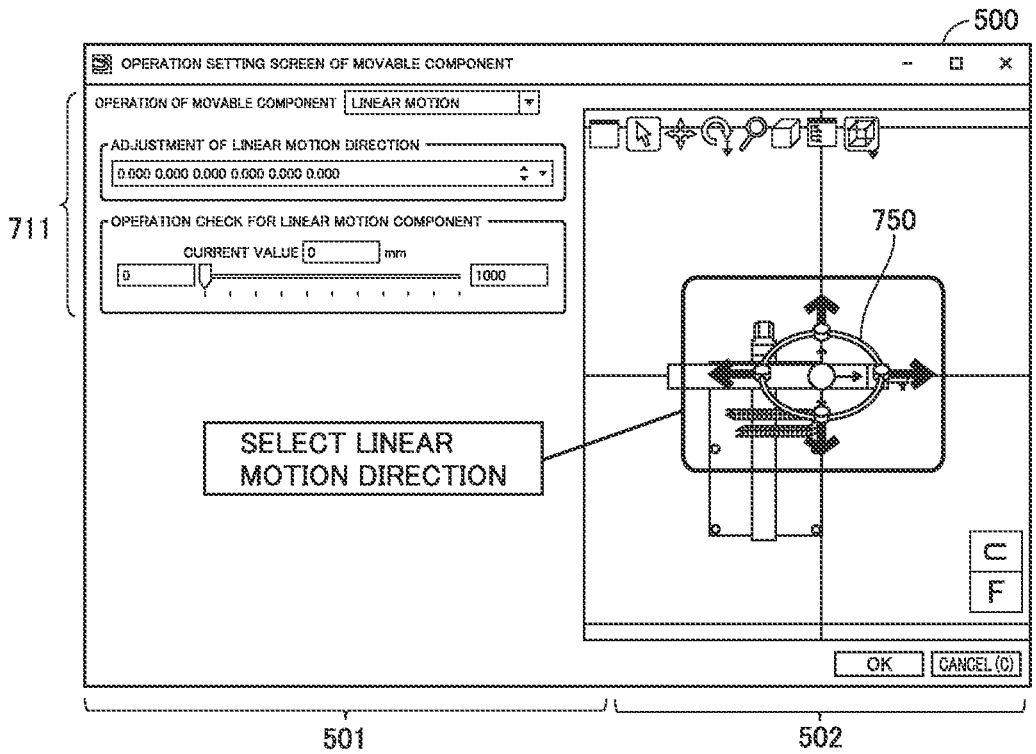

FIG. 7 is a diagram illustrating a third example of the operation flow of components being added to the simulation system. In the example illustrated in FIG. 7, a user selects the operation type of component 551, which is a movable component, on screen 500 and sets the operation range and direction of component 551. Specifically, the user selects the operation type of component 551 from an operation setting 710. In response to the operation type of component 551 being selected, what is currently displayed on setting screen 501 changes to a display including operation setting items 711. Next, the user may set the operation direction of component 551 by manipulating an icon 750 displayed on 3D screen 502. Icon 750 indicates different operation directions. In an aspect, a user may either drag icon 750 or use a movement key or the like on a keyboard in order to set the operation direction of component 551. The user may select the operation type of component 551 and also adjust the operation direction and range of component 551 by using operation setting items 711.

Figure 8:
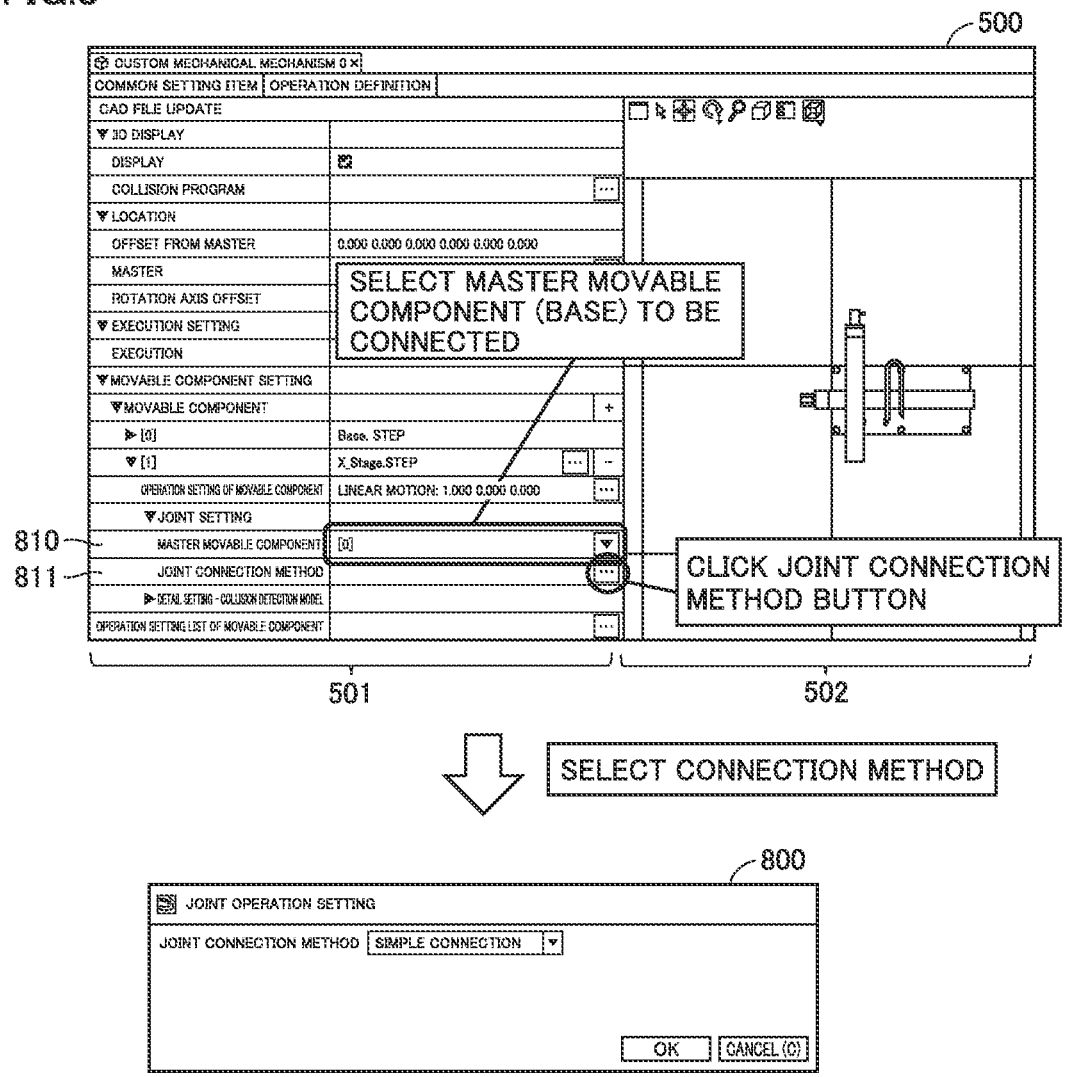
FIG. 8 is a diagram illustrating a fourth example of the operation flow of components being added to the simulation system.

FIG. 8 is a diagram illustrating a fourth example of the operation flow of components being added to the simulation system. In the example illustrated in FIG. 8, a user selects, through screen 500, the type of connection between component 550, which is an immovable component, and component 551, which is a movable component. Specifically, the user selects component 550, which is a master component for movable component 551, from a component selection list 810. Next, the user presses a connection method button 811 for joint. When connection method button 811 for joint is pressed, an operation setting dialog 800 for joint is displayed on display 109. The user may select a method of connection between components 550 and 551 on operation setting dialog 800 for joint.

As described above, a user may register a new assembly in the simulation system by carrying out the steps described with reference to FIGS. 5 to 8. The user may set the position, operation and connection method of each component included in the assembly.

D. Generation of Program

Referring to FIGS. 9 to 15, steps of generating the program of a newly registered assembly by the simulation system are described. The program generated by the simulation system includes the ladder program and text code.

Figure 9:
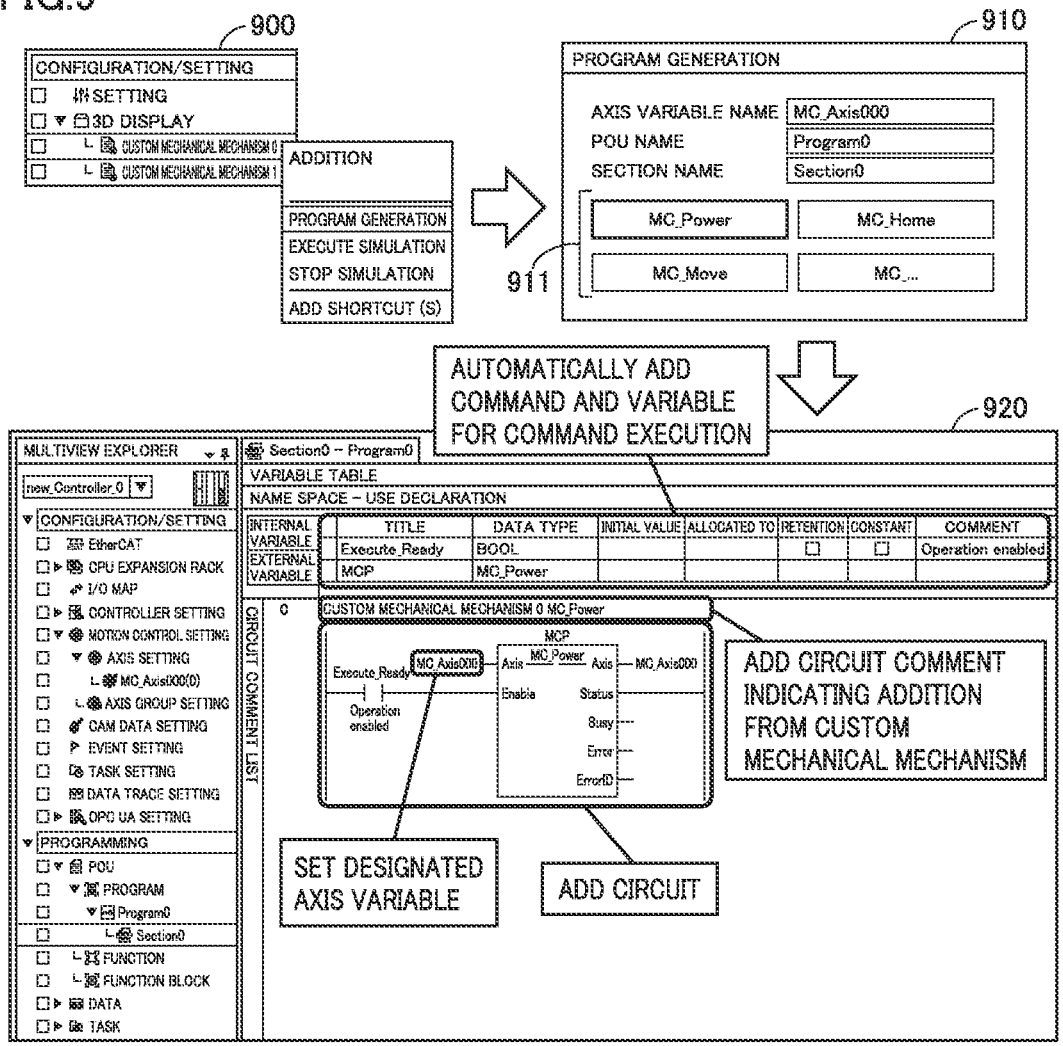
FIG. 9 is a diagram illustrating a first example of program generating steps carried out by the simulation system.

FIG. 9 is a diagram illustrating a first example of the program generating steps carried out by the simulation system. First, a user selects, from a menu screen 900 of the simulation system, a mechanism (assembly) registered in the simulation system and further selects program generation items in regard to this mechanism. As a result of the program generation items being selected, a program generation dialog 910 is displayed on display 109.

The user selects a desired feature from feature selection items 911 on program generation dialog 910. Feature selection items 911 include features (activation, initialization, operation, and the like) of the assembly. Based on one of the features being selected from feature selection items 911, the simulation system generates the ladder program of the selected feature and displays the generated ladder program on a screen 920. Screen 920 is a screen for editing the ladder program. The feature, "MC_Power", has been selected in the example illustrated in FIG. 9. In an aspect the simulation system may suitably change items to be included in feature selection items 911 based on the assembly information and template set 420.

The simulation system generates commands and variables necessary for the ladder program from information of the registered assembly. In an aspect, the simulation system may generate variables relating to the assembly and register the generated variables in variable data set 430 in response to the operation inputs illustrated in FIGS. 5 to 8.

The simulation system may insert the variables read from variable data set 430 (for example, axis variable or the like) into commands linked in advance to the feature selected from feature selection items 911. The simulation system may generate a comment relating to one module for each feature.

Figure 10:
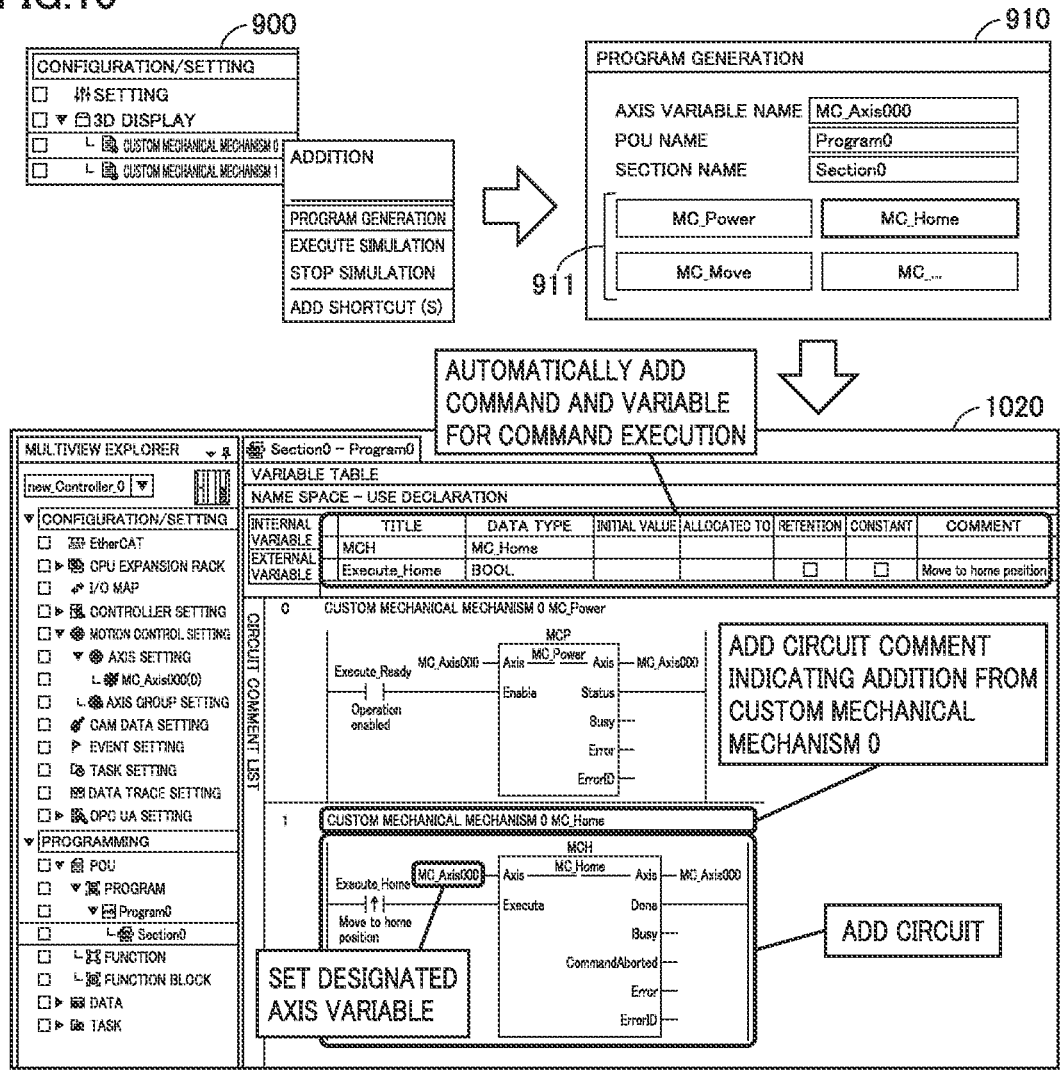
FIG. 10 is a diagram illustrating a second example of the program generating steps carried out by the simulation system.

FIG. 10 is a diagram illustrating a second example of the program generating steps carried out by the simulation system. In the example illustrated in FIG. 10, a user generates the ladder program of the feature "MC_Home" in steps similar to those illustrated in FIG. 9.

Since the POU and section names selected in program generation dialog 910 are the same, the ladder program of the feature "MC_Home" is displayed on a screen 1020 on which the ladder program of the feature "MC_Power" is also displayed. At the time, the simulation system locates circuits of the features "MC_Home" and "MC_Power" as different modules (though they share the same bus). Thus, modules are distinctly separated per feature, which allows a user to easily debug the features. Screen 1020 is screen 920 to which the ladder program of the feature "MC_Home" has been added.

Figure 11:
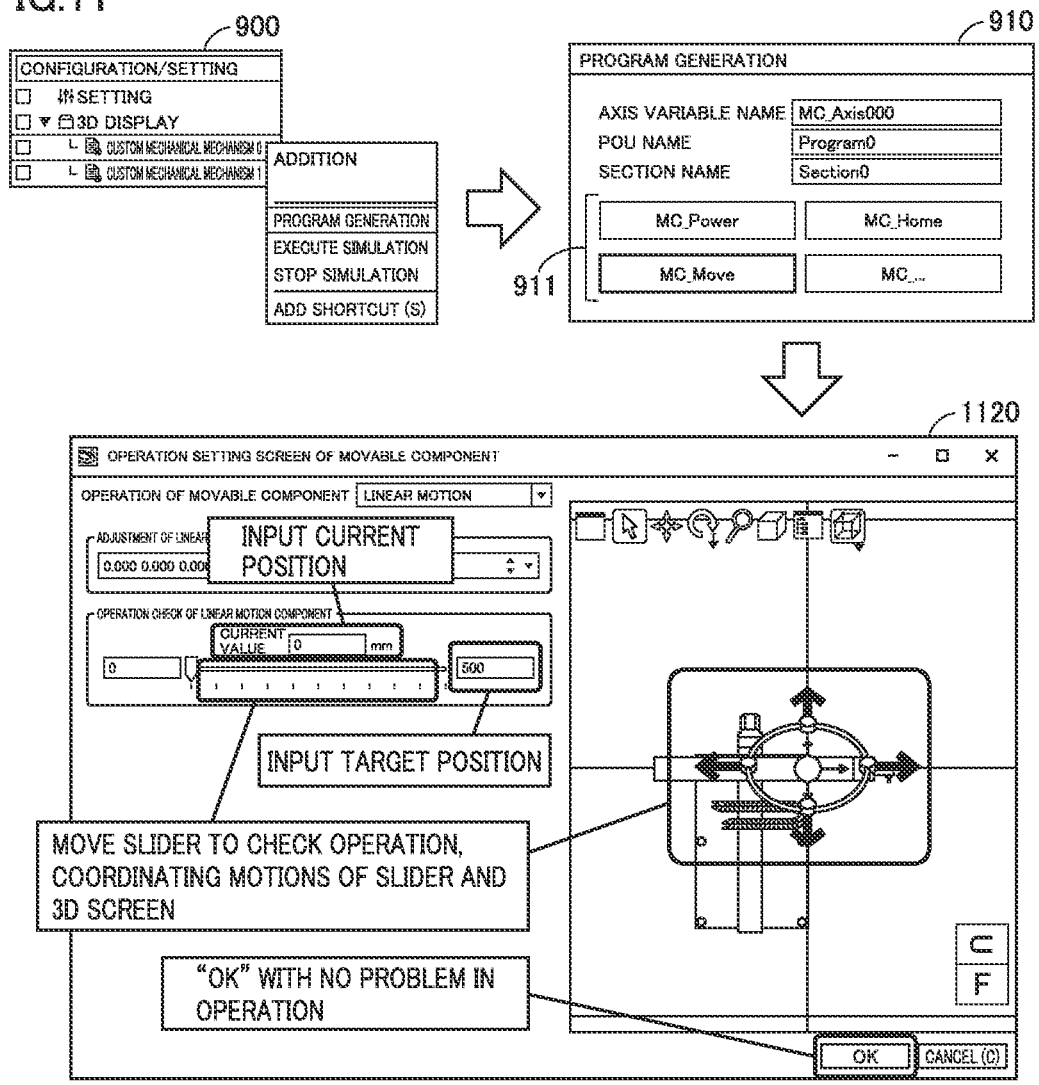
FIG. 11 is a diagram illustrating a third example of the program generating steps carried out by the simulation system.

FIG. 11 is a diagram illustrating a third example of the program generating steps carried out by the simulation system. In the example illustrated in FIG. 11, a user generates the ladder program of the feature "MC_Move" in steps similar to those illustrated in FIGS. 9 and 10.

The feature "MC_Move" includes a process to move the components (or assembly). Unlike the processes illustrated in FIGS. 9 and 10, the process to generate the ladder program of the feature "MC_Move" includes a process to receive the input of component operation settings by a user through a screen 1120 on which the operations of movable components are set. The simulation system displays screen 1120 in response to the feature of a component including its operation being selected from feature selection items 911. Screen 1120 is displayed and used to receive the input of component operation settings.

The user may input, through screen 1120, the current position (or initial position) and target position of a component. In an aspect, assuming that the input of component operation settings by a user on screen 500 is already completed, the simulation system may display a screen 1220 (see FIG. 12), instead of screen 1120, in response to the operation-included feature of the component being selected from feature selection items 911. The simulation system displays screen 1220 in response to an OK button on screen 1120 being pressed by the user.

Figure 12:
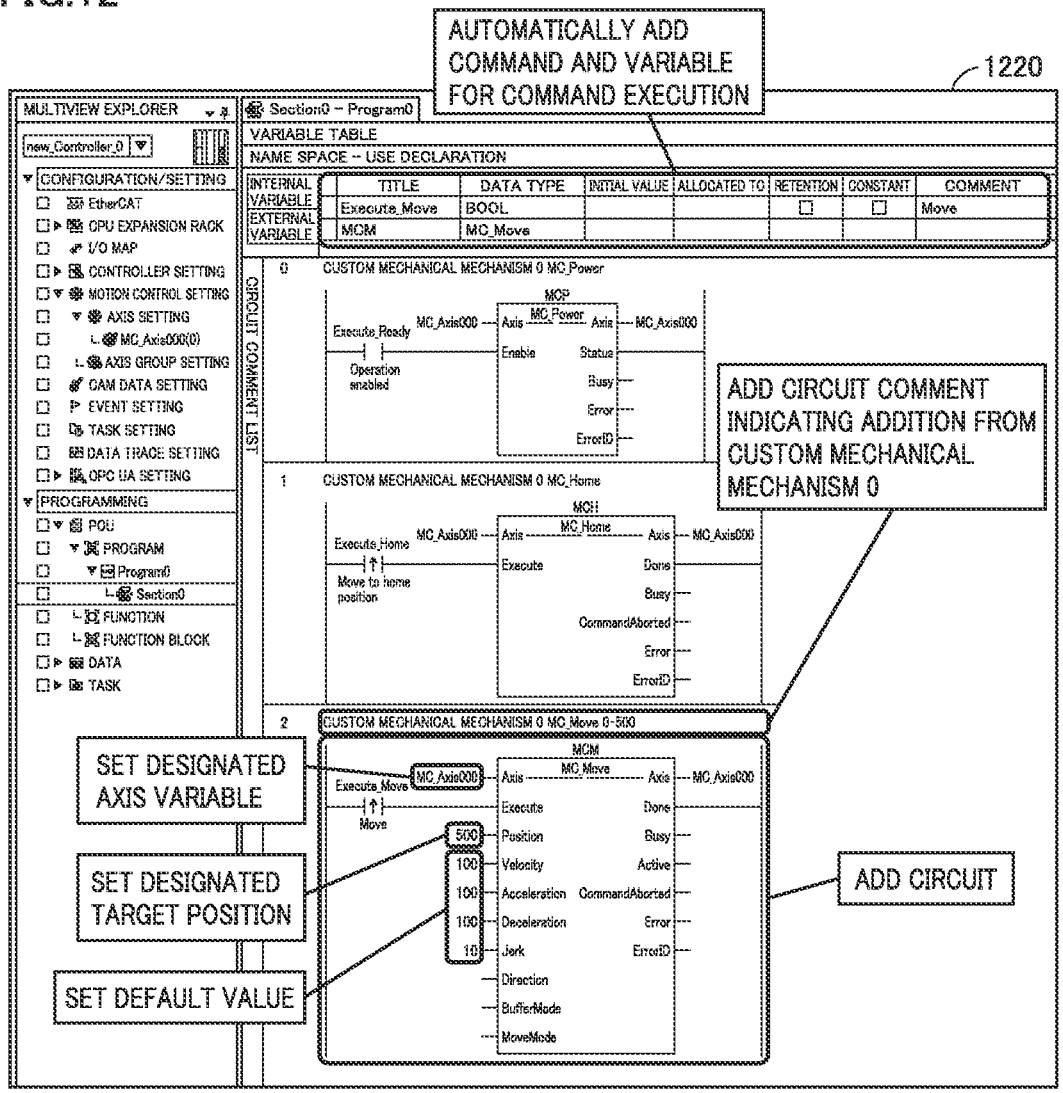
FIG. 12 is a diagram illustrating a fourth example of the program generating steps carried out by the simulation system.

FIG. 12 is a diagram illustrating a fourth example of the program generating steps carried out by the simulation system. In the example illustrated in FIG. 12, the generated ladder program of feature "MC_Move" is being displayed on screen 1220. Since the POU and section names selected in program generation dialog 910 are the same, the ladder program of the feature "MC_Move" is displayed on screen 1220 on which the ladder programs of the features "MC_Home" and "MC_Power" are also displayed. Screen 1220 is screen 1020 to which the ladder program of the feature "MC_Move" has been added.

For instance, the ladder program of the feature "MC_Move" may include the settings of; axis variable, target value, and default value of items other than the items set by a user.

Figure 13:
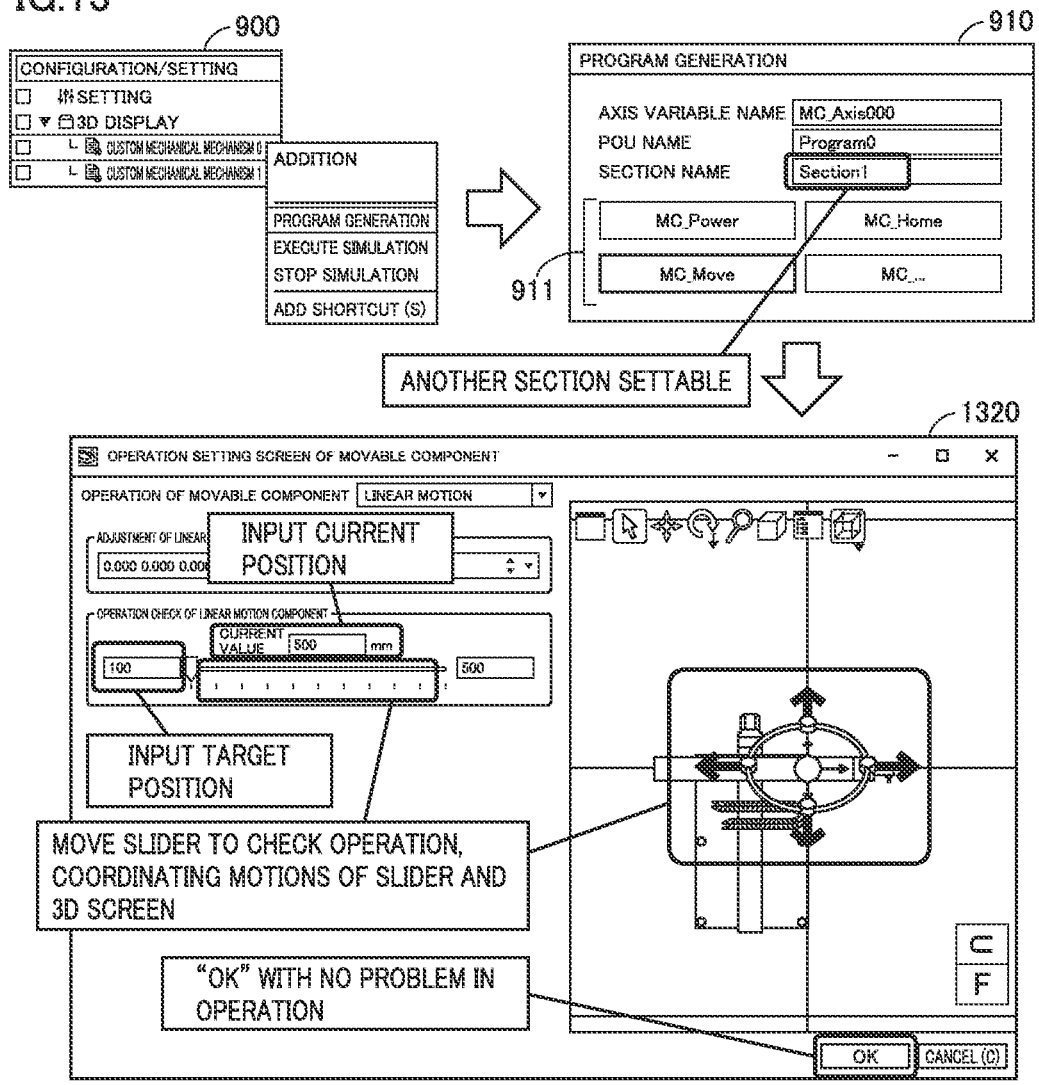
FIG. 13 is a diagram illustrating a fifth example of the program generating steps carried out by the simulation system.

FIG. 13 is a diagram illustrating a fifth example of the program generating steps carried out by the simulation system. Referring to FIG. 13, a description is given to a process for a section change in program generation dialog 910. The ladder program can be separated into units each called a "section". For instance, it is given that a user has changed the section name in program generation dialog 910, from "Section0" to "Section1", instead of the operation illustrated in FIG. 11. Also, the user has selected the feature "MC_Move" from feature selection items 911. Further, the user inputs the current position (or initial position) and target position of a component through a screen 1320 for operation settings of movable components. In this case, the simulation system displays a screen 1420 (see FIG. 14).

Figure 14:
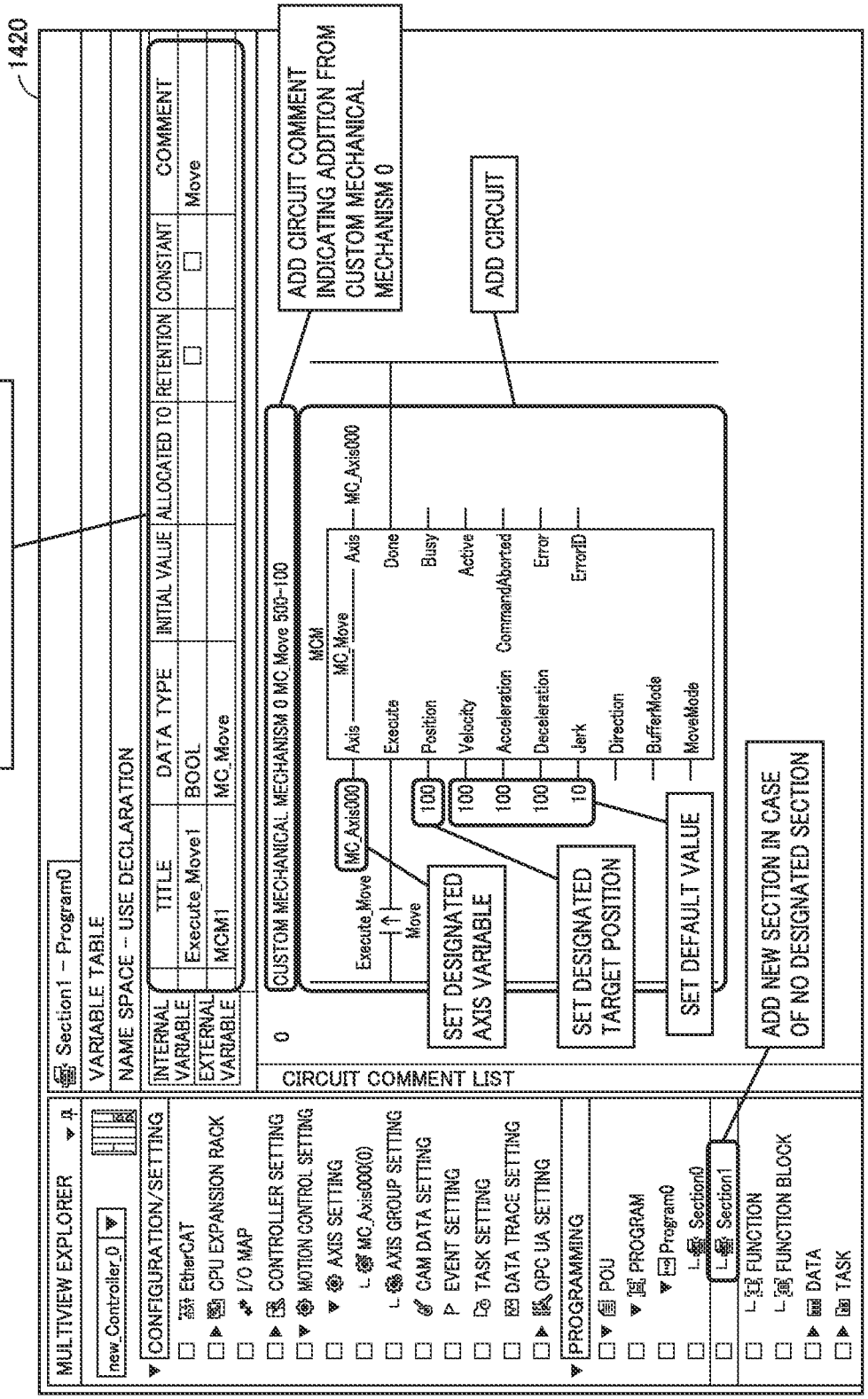
FIG. 14 is a diagram illustrating a sixth example of the program generating steps carried out by the simulation system.

FIG. 14 is a diagram illustrating a sixth example of the program generating steps carried out by the simulation system. Screen 1420 displays only the ladder program of the feature "MC_Move" included in "Section1". The ladder programs of the features "MC_Power" and "MC_Home" are included in the "Section0". When a user selects the "Section0" on the left side of screen 1420, the ladder programs of the features "MC_Power" and "MC_Home" are displayed on screen 1420. Thus, the simulation system has a feature that segments the ladder program per section. This feature allows a user to segment the sections into easily debuggable units.

Figure 15:
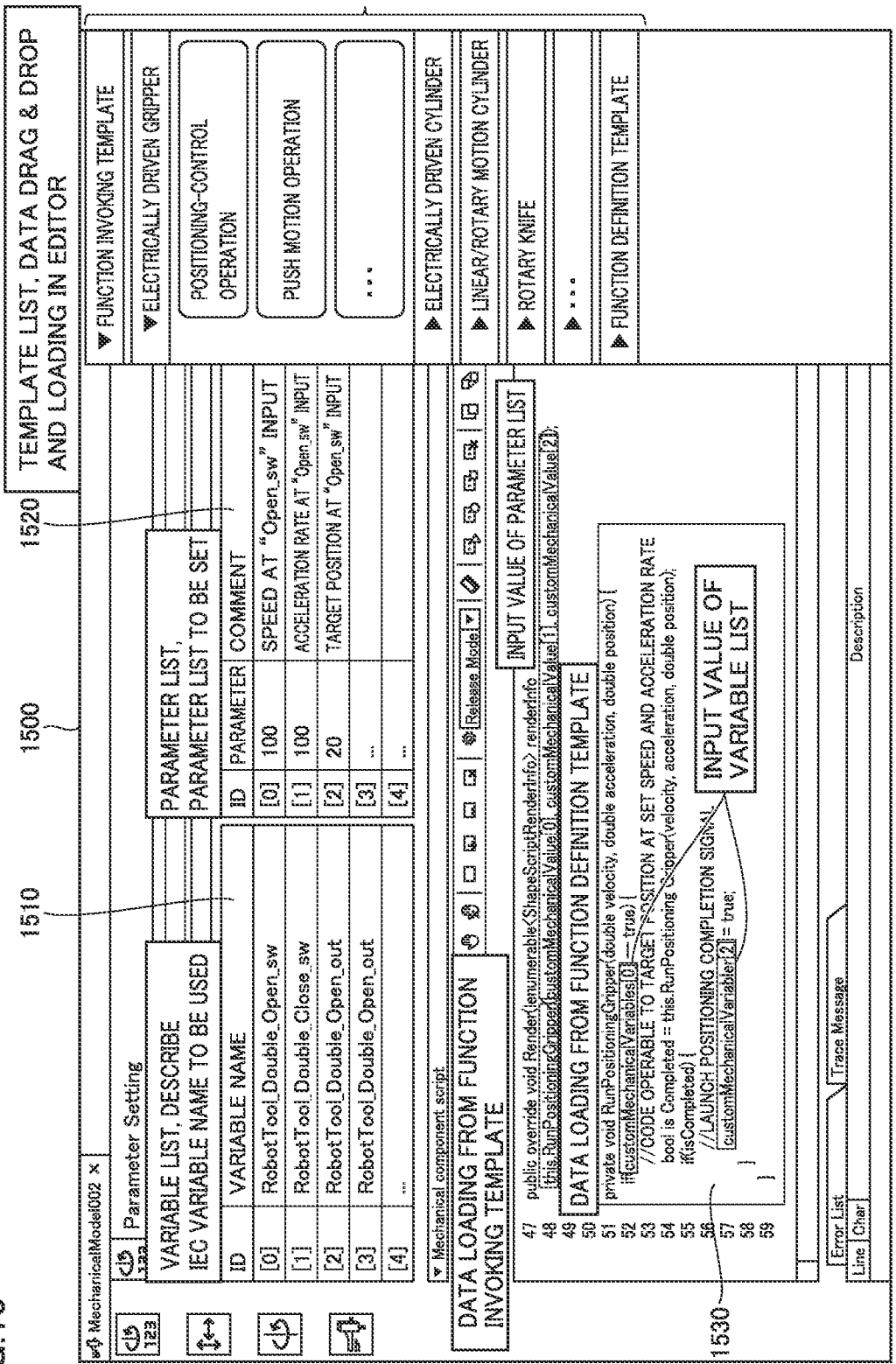
FIG. 15 is a diagram illustrating a seventh example of the program generating steps carried out by the simulation system.

FIG. 15 is a diagram illustrating a seventh example of the program generating steps carried out by the simulation system. Referring to FIG. 15, a text code generating process is described. The simulation system may generate the text code at the same time when the ladder program is generated.

A screen 1500 is a text code display screen. Screen 1500 includes a variable list 1510, a parameter list 1520, a source code (text code) 1530, and a template list 1540. In an aspect, screen 1500 may be a screen subsequent to the editing screens of the ladder program (for example, screens 920 to 1420) or menu screen 900.

A user can edit generated source code 1530 on screen 1500. In the simulation system, a variable selected from variable list 1510 (variable selected from variable data set 430) is inserted into a template selected from template set 420 to generate source code 1530. The parameters included in parameter list 1520 are assigned to the variables included in variable list 1510. The parameters included in parameter list 1520 are generated from the assembly information (component position, operation, connection and the like).

In an aspect, a user may select a desired template from template list 1540 on the right side of the screen and then add the template to source code 1530. The variable and parameter may be automatically set in the template added to source code 1530.

As described above, the simulation system may provide a user with a program that excels in readability by automatically generating the template-based text code (source code 1530). This may allow a user to easily correct and debug the text code as well as the ladder program.

In an aspect, each mathematical function of the text code generated from a newly registered assembly may be associated with each feature of a circuit on the ladder program generated from this newly registered assembly. In this case, the simulation system may decide the names of mathematical functions, variables and circuits so that correlation between the mathematical function and circuit feature can be known.

E. Flowchart

FIG. 16 is a flowchart illustrating an example of an internal processing flow of the simulation system. In an aspect, processor 102 may read, from storage 111 into main memory 104, a program for processing steps of FIG. 16 to be executed and then execute the stored program. In another aspect, the processing steps in whole or in part may be actualized in the form of circuit elements combined to execute these steps.

In step S1610, processor 102 adds the EtherCAT (registered trademark) servo motor, IO and axis to the simulation system based on a user's operation. These servo motor, IO and axis may be used as, for example, power source, input/output port, rotation axis, and the like of a component(s) newly added to the simulation system.

In step S1620, processor 102 adds a custom mechanical mechanism (component) to the simulation system based on a user's operation. In an aspect, the custom mechanical mechanism is CAD data.

In step S1630, processor 102 adds a movable component(s) to the simulation system based on a user's operation. In an aspect, the movable component is CAD data.

In step S1640, processor 102 sets the operation of the movable component based on a user's operation. Further, processor 102 may set a connection between the custom mechanical mechanism (first component) and the movable component (second component) based on a user's operation.

In step S1650, processor 102, based on a user's operation, checks the assembly operation including the custom mechanical mechanism and the movable component. In this step, processor 102 also sets various items (including, a movable range, a connection relationship, and the like) and automatically generates the program (ladder program and text code). In an aspect, processor 102 may receive operation inputs for various settings of the assembly and editing of the ladder program and the text code. In an aspect, processor 102 may generate the text code with reference to template set 420 and variable data set 430. In another aspect, processor 102 may generate the ladder program with reference to template set 420 and variable data set 430. Processor 102 stores the assembly information and program (ladder program and text code) in storage 111.

In step S1660, processor 102 checks the assembly operation using a 3D visualizer based on a user's operation. The user may suitably debug the ladder program and text code with reference to what is displayed by the 3D visualizer. The user can check whether there is any interference between the components included in the assembly based on what is displayed by the 3D visualizer.

The simulation system according to this embodiment has a feature that registers therein a new assembly containing optional components. The simulation system has a feature that automatically generates the ladder program and text code based on the settings of the assembly. These features may allow a user to easily conduct the simulation of a newly designed device and to generate and debug a program to operate the device.

F. Supplementary Note

Aspect 1

A simulation system, including:
a storage (111) configured to store data for use in a simulation; and
a controller (102) configured to execute the simulation, the controller (102) being configured to
receive an operation input for registration of a first component and a second component,
receive an operation input for setting of an operation of an assembly including the first and second components,
generate a program to operate the assembly on the basis of information on operations of the assembly, the first component, and the second component, and
store the program and the information on the operations of the assembly, the first component, and the second component in the storage (111) as the data for use in the simulation.

Aspect 2

The simulation system according to aspect 1, wherein receiving the operation input for setting of the operation of the assembly includes
receiving an operation input for registration of the first and second components in the assembly,
receiving an operation input for setting of the operation of the second component, and
receiving an operation input for setting of a connection between the first and second components.

Aspect 3

The simulation system according to aspect 2, wherein receiving the operation input for setting of the operation of the second component includes
receiving an operation input for selection of an operation type of the second component, and
receiving an operation input for setting of an operation range of the second component.

Aspect 4

The simulation system according to any one of aspects 1 to 3, wherein
the program includes a ladder program of the assembly, and
generating the program includes segmenting a module for each feature of the assembly and generating the ladder program.

Aspect 5

The simulation system according to aspect 4, wherein generating the program includes changing a section for each feature of the assembly and generating the ladder program.

Aspect 6

The simulation system according to any one of aspects 1 to 5, wherein generating the program includes generating one or a plurality of variables included in the program based on the information on the operations of the assembly, the first component, and the second component.

Aspect 7

The simulation system according to aspect 6, wherein the program includes a text code, and
generating the program includes
obtaining, from the storage (111), a template in which a command included in the text code is defined, and
inserting the variable into the template to generate the text code.

Aspect 8

The simulation system according to any one of aspects 1 to 7, wherein the controller (102) is configured to receive an operation input for editing of the program.

Aspect 9

A simulation method executable by a computer, the method including:
receiving an operation input for registration of a first component and a second component;
receiving an operation input for setting of an operation of an assembly including the first and second components;
generating a program to operate the assembly on the basis of information on operations of the assembly, the first component, and the second component; and
storing the program and the information on the operations of the assembly, the first component, and the second component as the data for use in the simulation.

Aspect 10

A program causing a computer to execute the method according to aspect 9.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A simulation system, comprising:
a storage configured to store data for use in a simulation; and
a controller configured to execute the simulation,
the controller being configured to add an assembly to the simulation system,
wherein, to add the assembly, the controller is configured to:
receive an operation input for registration of a first component and a second component of the assembly in the simulation system,
receive an operation input to configure the second component as a movable component,
receive an operation input to identify a connection relationship between the movable component and the first component,
receive an operation input to configure operation settings of the movable component, based on the connection relationship,
generate codes to be executed by a control system based on the operation settings of the movable component,
generate a program to operate the assembly based on the codes, and
store the program and the codes in the storage as the data for use in the simulation.

2. The simulation system according to claim 1, wherein receiving the operation input to configure the operation settings of the movable component includes:
receiving an operation input selection of a movement type of the movable component, and
receiving an operation input for setting of a movement range of the movable component.

3. The simulation system according to claim 1, wherein;
the program includes a ladder program of the assembly, and
generating the program includes segmenting a module for each feature of a plurality of features of the assembly and generating the ladder program.

4. The simulation system according to claim 3, wherein generating the program includes changing a section for each feature of the assembly and generating the ladder program.

5. The simulation system according to claim 1, wherein generating the program includes generating one or more variables included in the program based on the codes.

6. The simulation system according to claim 5, wherein:
the program includes source code, and
generating the program includes:
obtaining, from the storage, a template corresponding to the operation settings, and
inserting a variable into the template to generate the source code.

7. The simulation system according to claim 1, wherein the controller is configured to receive an operation input for editing of the program.

8. A simulation method executable by a computer, the simulation method comprising:
receiving an operation input for registration of a first component and a second component of a new assembly;
receiving an operation input to configured the second component as a movable component;
receive an operation input to identify a connection relationship between the movable component and the first component;
receiving an operation input to configure operation settings of the movable component, based on the connection relationship;
generating codes to be executed by a control system based on the operation settings of the movable component;
generating a program to operate the new assembly based on the codes; and
storing the program and the codes as the data for use in a simulation.

9. The simulation method according to claim 8, wherein receiving the operation input to configure operation settings of the movable component includes:
receiving an operation input for selection of a movement type of the movable component, and
receiving an operation input for setting of a movement range of the movable component.

10. The simulation method according to claim 8, wherein:
the program includes a ladder program of the assembly, and
generating the program includes segmenting a module for each feature of a plurality of features of the assembly and generating the ladder program.

11. The simulation method according to claim 10, wherein generating the program includes changing a section for each feature of the assembly and generating the ladder program.

12. The simulation method according to claim 8, wherein generating the program includes generating one or more variables included in the program based on the codes.

13. The simulation method according to claim 12, wherein:
the program includes source code, and
generating the program includes:
obtaining, from the storage, a template corresponding to the operation settings, and
inserting a variable into the template to generate the source code.

14. The simulation method according to claim 8, further comprising receiving an operation input for editing of the program.

15. A non-transitory computer-readable medium comprising instructions that, when executed by a simulation system, cause the simulation system to:
receive an operation input for registration of a first component and a second component of a new assembly;
receive an operation input to configure the second component as a movable component;
receiving an operation input to identify a connection relationship between the movable component and the first component;
receive an operation input to configure operation settings of the movable component, based on the connection relationship;
generate codes to be executed by a control system based on the operation settings;
generate a program to operate the assembly based on the codes; and
store the program and the codes as the data for use in a simulation.

16. The non-transitory computer-readable medium according to claim 15, wherein receiving the operation input to configure operation settings of the movable component includes:
receiving an operation input for selection of a movement type of the movable component, and
receiving an operation input for setting of a movement range of the movable component.

17. The non-transitory computer-readable medium according to claim 15, wherein:
  the program includes a ladder program of the assembly, and
  generating the program includes segmenting a module for each feature of the assembly and generating the ladder program.

* * * * *